(12) United States Patent
Ng et al.

(10) Patent No.: US 10,510,880 B2
(45) Date of Patent: *Dec. 17, 2019

(54) TRENCH POWER MOSFET

(71) Applicant: Taiwan Semiconductor Manufacturing Company, Ltd., Hsinchu (TW)

(72) Inventors: Chun-Wai Ng, Hsinchu (TW); Hsueh-Liang Chou, Jhubei (TW); Ruey-Hsin Liu, Hsinchu (TW); Po-Chih Su, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/160,443

(22) Filed: Oct. 15, 2018

(65) Prior Publication Data

US 2019/0051745 A1    Feb. 14, 2019

Related U.S. Application Data

(60) Continuation of application No. 15/220,669, filed on Jul. 27, 2016, now Pat. No. 10,109,732, which is a (Continued)

(51) Int. Cl.
*H01L 29/78* (2006.01)
*H01L 29/40* (2006.01)
(Continued)

(52) U.S. Cl.
CPC .... *H01L 29/7813* (2013.01); *H01L 21/02233* (2013.01); *H01L 21/266* (2013.01);
(Continued)

(58) Field of Classification Search
CPC .......... H01L 29/66734; H01L 29/7813; H01L 29/66727; H01L 21/26586
See application file for complete search history.

(56) References Cited

U.S. PATENT DOCUMENTS

| | | |
|---|---|---|
| 6,870,220 B2 | 3/2005 | Kocon et al. |
| 7,232,726 B2 | 6/2007 | Peake et al. |

(Continued)

FOREIGN PATENT DOCUMENTS

| | | |
|---|---|---|
| KR | 20020000775 A | 1/2002 |
| KR | 20080015863 A | 2/2008 |

(Continued)

OTHER PUBLICATIONS

Goarin, P., et al., "Split-gate Resurt Stepped Oxide (RSO) MOSFETs for 25V applications with record low gate-to-drain charge", Proceedings of the 19th International Symposium on Power Semiconductor Devices & ICs, May 27-30, 2007, Jeju, Korea, IEEE, 4 pages.

*Primary Examiner* — Stephen M Bradley
(74) *Attorney, Agent, or Firm* — Slater Matsil, LLP

(57) ABSTRACT

A device includes a semiconductor region of a first conductivity type, a trench extending into the semiconductor region, and a conductive field plate in the trench. A first dielectric layer separates a bottom and sidewalls of the field plate from the semiconductor region. A main gate is disposed in the trench and overlapping the field plate. A second dielectric layer is disposed between and separating the main gate and the field plate from each other. A Doped Drain (DD) region of the first conductivity type is under the second dielectric layer, wherein an edge portion of the main gate overlaps the DD region. A body region includes a first portion at a same level as a portion of the main gate, and a second portion at a same level as, and contacting, the DD (Continued)

region, wherein the body region is of a second conductivity type opposite the first conductivity type.

20 Claims, 10 Drawing Sheets

Related U.S. Application Data continuation of application No. 14/878,284, filed on Oct. 8, 2015, now Pat. No. 9,412,844, which is a continuation of application No. 14/525,433, filed on Oct. 28, 2014, now Pat. No. 9,171,931, which is a division of application No. 13/486,681, filed on Jun. 1, 2012, now Pat. No. 8,896,060.

(51) Int. Cl.
| | |
|---|---|
| *H01L 29/66* | (2006.01) |
| *H01L 29/08* | (2006.01) |
| *H01L 21/265* | (2006.01) |
| *H01L 21/02* | (2006.01) |
| *H01L 21/266* | (2006.01) |
| *H01L 29/10* | (2006.01) |
| *H01L 29/423* | (2006.01) |
| *H01L 29/49* | (2006.01) |
| *H01L 29/417* | (2006.01) |

(52) U.S. Cl.
CPC .... *H01L 21/26586* (2013.01); *H01L 29/0878* (2013.01); *H01L 29/0882* (2013.01); *H01L 29/1095* (2013.01); *H01L 29/407* (2013.01); *H01L 29/4236* (2013.01); *H01L 29/495* (2013.01); *H01L 29/4916* (2013.01); *H01L 29/66727* (2013.01); *H01L 29/66734* (2013.01); *H01L 29/41766* (2013.01); *H01L 29/42368* (2013.01)

(56) References Cited

U.S. PATENT DOCUMENTS

| | | | |
|---|---|---|---|
| 7,427,795 B2 | 9/2008 | Pendharkar | |
| 7,504,303 B2 | 3/2009 | Yilmaz et al. | |
| 8,053,277 B2 | 11/2011 | Yu et al. | |
| 8,278,731 B2 | 10/2012 | Sumitomo et al. | |
| 8,304,825 B2 | 11/2012 | Garnett | |
| 8,471,331 B2 | 6/2013 | Iyer et al. | |
| 8,482,061 B2 | 7/2013 | Nishimura | |
| 8,525,354 B2 | 9/2013 | Wu | |
| 9,412,844 B2 * | 8/2016 | Ng | H01L 21/26586 |
| 2001/0038151 A1 | 11/2001 | Takahashi et al. | |
| 2002/0000775 A1 | 1/2002 | Shimazu et al. | |
| 2004/0166636 A1 | 8/2004 | Darwish | |
| 2005/0001268 A1 | 1/2005 | Baliga | |
| 2005/0095789 A1 | 5/2005 | Blanchard | |
| 2005/0161795 A1 | 7/2005 | Tong | |
| 2006/0091455 A1 | 5/2006 | Adan | |
| 2006/0267090 A1 | 11/2006 | Sapp et al. | |
| 2006/0292773 A1 | 12/2006 | Goolsby et al. | |
| 2007/0018273 A1 | 1/2007 | Miller, Jr. et al. | |
| 2007/0222024 A1 | 9/2007 | Stecher | |
| 2007/0262395 A1 | 11/2007 | Gibbons et al. | |
| 2008/0015863 A1 | 1/2008 | Agapi et al. | |
| 2008/0057637 A1 | 3/2008 | Choi | |
| 2008/0258213 A1 | 10/2008 | Yilmaz et al. | |
| 2009/0053880 A1 | 2/2009 | Manabe | |
| 2009/0283823 A1 | 11/2009 | Izumi | |
| 2010/0308400 A1 | 12/2010 | Darwish et al. | |
| 2011/0062513 A1 | 3/2011 | Lin et al. | |
| 2011/0241108 A1 | 10/2011 | Zuniga | |
| 2012/0068231 A1 | 3/2012 | Garnett | |
| 2012/0104490 A1 | 5/2012 | Yilmaz et al. | |
| 2012/0196414 A1 | 8/2012 | Ngai et al. | |
| 2013/0320435 A1 | 12/2013 | Ng et al. | |
| 2013/0320437 A1 | 12/2013 | Ng et al. | |
| 2015/0044837 A1 | 2/2015 | Ng et al. | |
| 2015/0104917 A1 | 4/2015 | Ng et al. | |

FOREIGN PATENT DOCUMENTS

| | | |
|---|---|---|
| TW | I289355 A | 11/2007 |
| TW | 201140841 A | 11/2011 |
| TW | 201216473 A | 4/2012 |

* cited by examiner

TRENCH POWER MOSFET

PRIORITY CLAIM AND CROSS-REFERENCE

This application is a continuation of U.S. patent application Ser. No. 15/220,669, entitled "Trench Power MOSFET," filed Jul. 27, 2016, which is a continuation of U.S. patent application Ser. No. 14/878,284, entitled "Trench Power MOSFET," filed Oct. 8, 2015, now U.S. Pat. No. 9,412,844 issued Aug. 9, 2016, which application is a continuation of U.S. patent application Ser. No. 14/525,433, entitled "Trench Power MOSFET," filed Oct. 28, 2014, now U.S. Pat. No. 9,171,931 issued Oct. 27, 2015, which application is a divisional of U.S. patent application Ser. No. 13/486,681, entitled "Trench Power MOSFET," filed on Jun. 1, 2012, now U.S. Pat. No. 8,896,060 issued Nov. 25, 2014, which applications are incorporated herein by reference.

BACKGROUND

In a conventional split-gate trench power Metal-Oxide-Semiconductor Field Effect Transistor (MOSFET), a polysilicon gate is divided into an upper part and a lower part, both formed in a trench. The upper part and the lower part are separated from each other by a dielectric layer. The upper part serves as the main gate for controlling the channel of the power MOSFET, and the lower part serves as the field plate for reducing surface electrical field. Accordingly, the depth of the main gate depends on the depth of the trench and the thickness of the dielectric layer filled in the recess. Both the depth of the trench and the thickness of the dielectric layer suffer from process variations, and are difficult to control.

The power MOSFET includes a p-body, in which the channel of the power MOSFET is formed to connect a source region over the p-body and a drain region under the p-body. To ensure that an entirety of the channel can be controlled by the main gate, an n-type epitaxy layer that is under the p-body needs to have at least a portion at a same level as the main gate. Since the depth of the main gate is difficult to control, a large process window is required to ensure that the epitaxy region has at least a portion at a same level as the main gate. The large process window, however, means that the gate-to-drain overlap is also large, the gate-to-drain capacitance is in turn large, and the variation of the gate-to-drain capacitance is also large. This results in the degradation in the performance of the power MOSFET and the large variation in the performance of the power MOSFET.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A trench power Metal-oxide-Semiconductor Field Effect Transistor (MOSFET) and the method of forming the same are provided in accordance with various exemplary embodiments. The intermediate stages of forming the trench power MOSFET are illustrated. The variations of the embodiments are discussed. Throughout the various views and illustrative embodiments, like reference numbers are used to designate like elements.

Figure 1B:
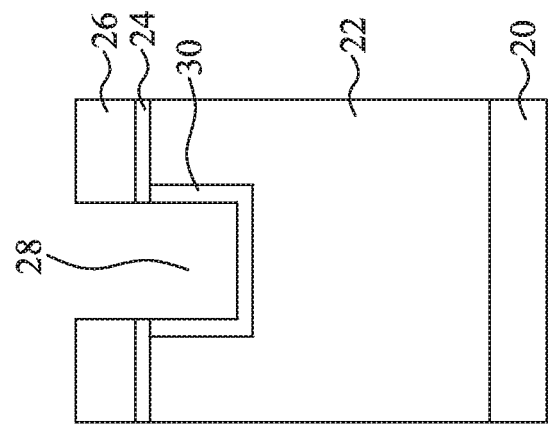
FIGS. 1A through 1J are cross-sectional views of intermediate stages in the manufacturing of a trench power Metal-Oxide-Semiconductor Field Effect Transistor (MOSFET) in accordance with some exemplary embodiments.
Figure 1A:
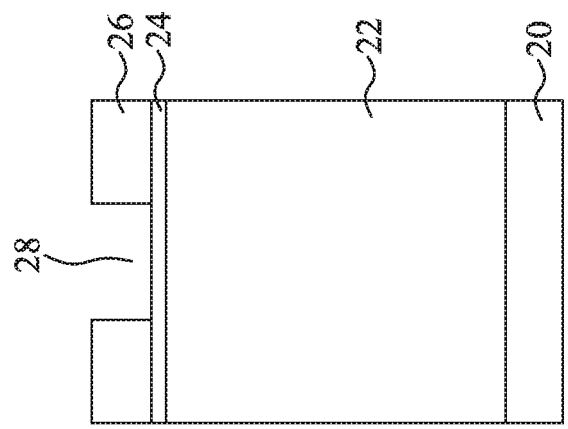

FIGS. 1A through 1J are cross-sectional views of intermediate stages in the formation of an n-type trench power MOSFET. Referring to FIG. 1A, semiconductor region 20, which is a portion of a semiconductor substrate, is provided. Semiconductor region 20 and the respective semiconductor substrate may have a crystalline silicon structure. Alternatively, semiconductor region 20 and the respective semiconductor substrate may be formed of other semiconductor materials such as silicon germanium. The semiconductor substrate may be a bulk substrate. In some embodiments, semiconductor region 20 is a heavily doped layer doped with an n-type impurity such as phosphorous or arsenic, for example, to an impurity concentration between about $10^{19}$/$cm^3$ and about $10^{21}$/$cm^3$. In the described embodiments, the term "heavily doped" means an impurity concentration of above about $10^{19}$/$cm^3$. One skilled in the art will recognize, however, that "heavily doped" is a term of art that depends upon the specific device type, technology generation, minimum feature size, and the like. It is intended, therefore, that the term be interpreted in light of the technology being evaluated and not be limited to the described embodiments.

Over heavily doped semiconductor region 20, epitaxy layer 22 is formed through epitaxy, and is lightly doped with an n-type impurity. The impurity concentration of epitaxy layer 22 may be between about $10^{15}$/$cm^3$ and about $10^{18}$/$cm^3$. Epitaxy layer 22 may be a crystalline silicon layer, although other semiconductor material may be used. Pad oxide layer 24 and hard mask 26 are then formed over epitaxy layer 22. In some embodiments, pad oxide layer 24 is formed by thermally oxidizing a top layer of epitaxy layer 22, and hence pad oxide layer 24 comprises silicon oxide. Hard mask layer 26 may be formed of silicon nitride, for example. Hard mask layer 26 is patterned to form trench 28 therein.

Next, as shown in FIG. 1B, pad oxide layer 24 and epitaxy layer 22 are etched using the patterned hard mask layer 26 as an etching mask, so that trench 28 extends into epitaxy layer 22. A further oxidation is then performed to form oxide layer 30 on the exposed surfaces of epitaxy layer 22, which exposed surfaces are in trench 28. Oxide layer 30 includes sidewall portions and a bottom portion. Next, referring to FIG. 1C, a further hard mask layer 32 is formed on oxide layer 30. Hard mask layer 32 may be formed using a conformal deposition method, and thickness T1 of the horizontal portion is close to the thickness T2 of the vertical portion of hard mask layer 32. Hard mask layer 32 includes sidewall portions on the sidewall portions of oxide layer 30, and a bottom portion on the bottom portion of oxide layer 30. In some exemplary embodiments, thickness T2 is between about 10 nm and about 1,000 nm. It is appreciated that the dimensions recited throughout the description are merely examples, and may be changed to different values.

Figure 1D:
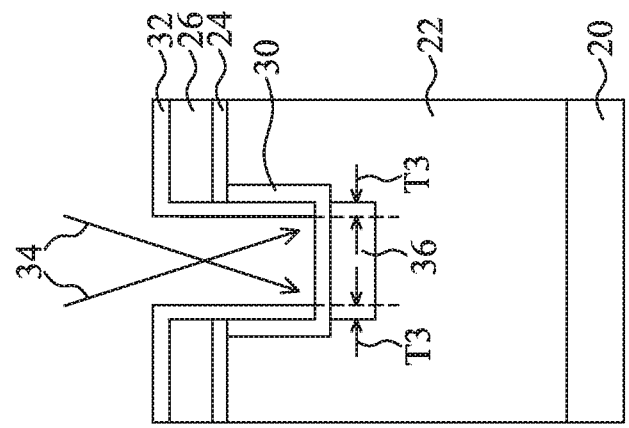

Referring to FIG. 1D, the bottom portion of hard mask layer 32 is removed. A tilt implantation 34 is then performed to implant an n-type impurity into epitaxy layer 22, so that N-type Doped Drain (NDD) region 36 is formed in epitaxy layer 22. The NDD region 36 is self-aligned to the hard mask layer 32. The implanted n-type impurity may include phosphorous and/or arsenic. Tilt implantation 34 may include two tilt implantations that tilt to opposite directions. NDD region 36 laterally extends beyond the edges of hard mask layer 32 by distance T3. In some exemplary embodiments, distance T3 is between about 10 nm and about 1,000 nm, although distance T3 may be greater or smaller. The n-type impurity concentration of NDD regions 36 may be between about $10^{15}/cm^3$ and about $10^{18}/cm^3$. Furthermore, the ratio of the n-type impurity concentration in NDD regions 36 to the n-type impurity concentration of epitaxy region 22 may be greater than about 2 orders (100 times).

Figure 1C:
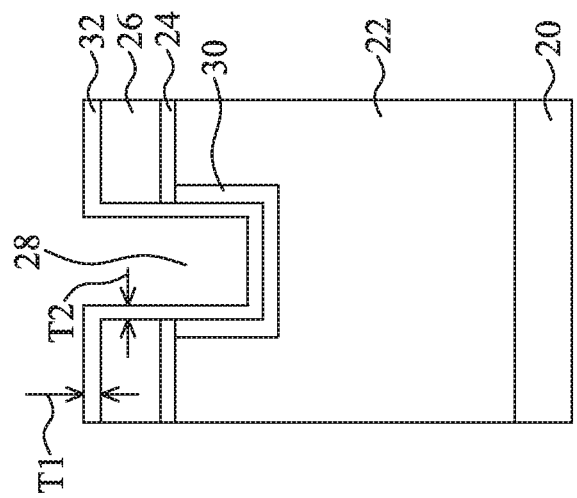
Figure 1F:
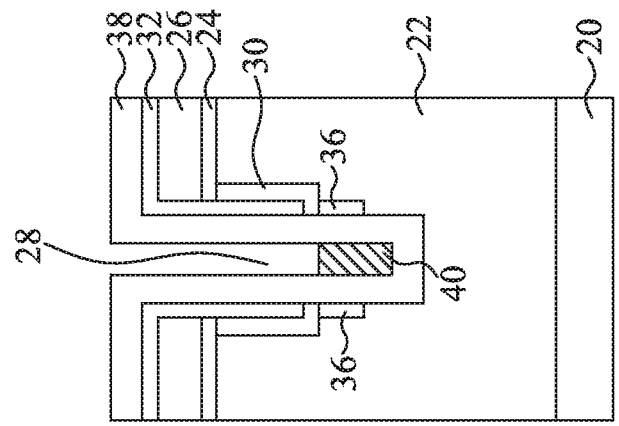
Figure 1E:
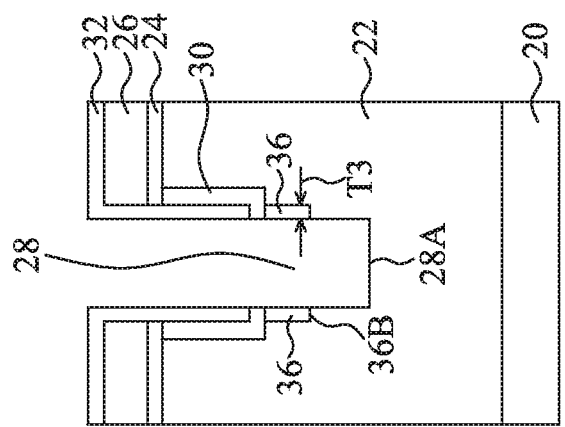

Next, referring to FIG. 1E, an etching step is performed to etch the bottom portion of oxide layer 30 and the underlying portion of epitaxy layer 22, so that trench 28 extends down into epitaxy layer 22. The bottom surface 28A of trench 28 may be lower than the bottom surface 36B of NDD regions 36 in accordance with some embodiments. The etch step is performed using hard mask layer 32 as an etching mask. The etching may be substantially anisotropic, and some portions of NDD region 36 are left on opposite sides of trench 28.

FIG. 1F illustrates the deposition for forming dielectric layer 38. In some embodiments, dielectric layer 38 comprises silicon oxide, although other dielectric materials that are suitable for forming gate dielectrics may also be used. Dielectric layer 38 comprises a portion at the bottom of trench 28, and sidewall portions on the sidewalls of trench 28. Dielectric layer 38 may be formed using a conformal deposition method. After the formation of dielectric layer 38, a portion of trench 28 is not filled.

As also illustrated in FIG. 1F, after the formation of dielectric layer 38, a conductive material is filled into trench 28, and is then etched back. In the etch-back step, a portion of the conductive material in trench 28 remains not etched, and the portion of the conductive material outside trench 28 is removed. The remaining portion of the conductive material forms field plate 40. In some embodiments, field plate 40 comprises polysilicon, although other conductive materials such as metals, metal silicides, or the like, may also be used.

Figure 1H:
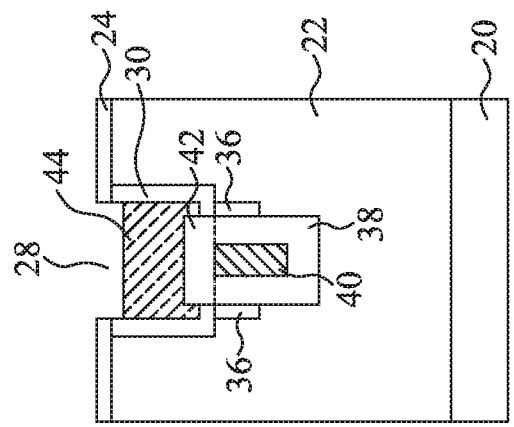
Figure 1G:
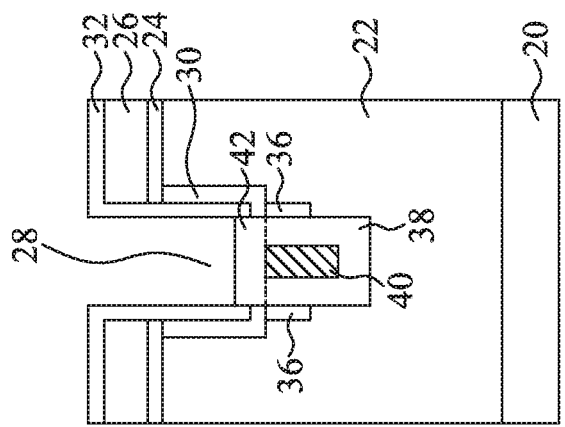

Referring to FIG. 1G, a further dielectric layer 42 is formed, and then etched back. Again, in the etch-back step, a portion of dielectric layer 42 in trench 28 remains, and the portion of dielectric layer 42 outside trench 28 is removed. Dielectric layer 42 is over field plate 40. Dielectric layer 42 may be formed of silicon oxide in some exemplary embodiments. Next, referring to FIG. 1H, hard mask layers 32 and 26 are removed, for example using diluted HF solution. Pad oxide layer 24, oxide layer 30, and dielectric layers 38 and 42, however, are not etched. Due to the removal of hard mask layer 32 from trench 28, trench 28 is expanded laterally, and pad oxide layer 24, oxide layer 30, and dielectric layer 42 are exposed.

Next, as also shown in FIG. 1H, an additional conductive material is filled into trench 28, and is then etched back. In the etch-back step, a portion of the conductive material in trench 28 remains, and the portion of the conductive material outside trench 28 is removed. The remaining portion of the conductive material forms main gate 44, which is separated from field plate 40 by dielectric layer 42.

Figure 1J:
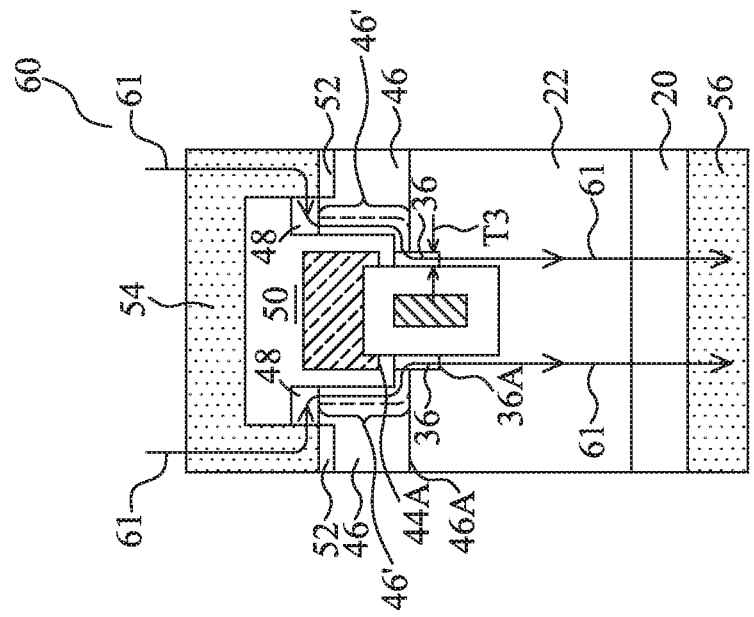
Figure 1I:
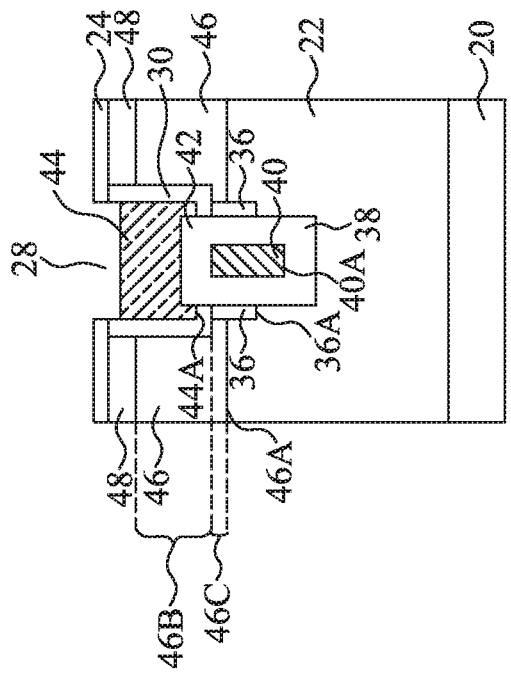

In subsequent steps, as shown in FIG. 1I, an implantation is performed to form p-bodies 46 in a top layer of epitaxy layer 22. P-bodies 46 are formed on opposite sides of main gate 44. P-bodies 46 comprise a p-type impurity such as boron, indium, and/or the like. The bottoms 46A of p-bodies 46 are lower than the bottom surface 44A of main gate 44, and are higher than the bottom surfaces 36A of NDD regions 36. Accordingly, p-bodies 46 are in contact with the respective NDD regions 36. In some embodiments, p-bodies 46 have a p-type impurity concentration between about $10^{15}/cm^3$ and about $10^{18}/cm^3$. A further implantation is performed to form heavily doped n-type regions 48, which may have an n-type impurity concentration between about $10^{19}/cm^3$ and about $10^{21}/cm^3$, for example. P-bodies 46 include upper portions 46B that are level with main gate 44, and lower portions 46C that are level with, and contacting NDD regions 36.

Next, referring to FIG. 1J, Inter-Layer Dielectric (ILD) 50 is formed over the structure shown in FIG. 1I, and is formed over main gate 44. ILD 50 may comprise Phospho-Silicate glass (PSG), Boro-Silicate Glass (BSG), Boron-Doped Phospho-Silicate Glass (BPSG), Tetraethyl Orthosilicate (TEOS) oxide, or the like. ILD 50 may be formed as a blanket layer. Contact openings (filled with source regions 54 in FIG. 1J) are then formed by etching ILD 50 and some portions of heavily doped n-type regions 48. After the contact opening formation, the sidewalls of heavily doped n-type regions 48 are exposed, and the top surfaces of p-bodies 46 are also exposed.

Next, as also shown in FIG. 1J, an implantation is performed to dope a p-type impurity into the contact openings and into p-bodies 46, so that heavily doped p-type regions 52 are formed in the surface regions of p-bodies 46. Heavily doped p-type regions 52 act as the pickup regions of p-bodies 46. Next, a conductive material is deposited to form source region 54. Furthermore, a conductive material is deposited on heavily doped semiconductor region 20 to form drain region 56. Source region 54 and drain region 56 may also be deposited on the opposite surfaces of the respective wafer/die. In some embodiments, source region 54 and drain region 56 are formed of a metal or a metal alloy such as aluminum, copper, tungsten, nickel, and/or the like. Power MOSFET 60 is thus formed. The electrical connections to main gate 44 and field plate 40 may be formed by forming contact plugs, which contact plugs are not in the plane shown in FIG. 1J, and hence are not shown. In some embodiments, field plate 40 is electrically coupled to, and at a same voltage as, source region 54. In alternative embodiments, field plate 40 is disconnected from source region 54, and is applied with a voltage separate from the voltage of source region 54.

An on-current of power MOSFET 60 is schematically illustrated using curved lines 61, which pass through source region 54, heavily doped n-type regions 48, channel regions 46' in p-type bodies 46, NDD regions 36, epitaxy layer 22, and semiconductor region 20, and reach drain region 56.

It is observed that main gate 44 and NDD regions 36 have overlaps, the width of the overlapped area is affected by thickness T3 of NDD regions 36. The overlap width and the overlap width variation are both small. Accordingly, since NDD regions 36 form parts of the drain region of power MOSFET 60, the gate-to-drain capacitance is small. It is observed that the overlap width is substantially not affected by the process variation in the depth of various feature formed in the steps shown in FIGS. 1E through 1H.

Figure 2B:
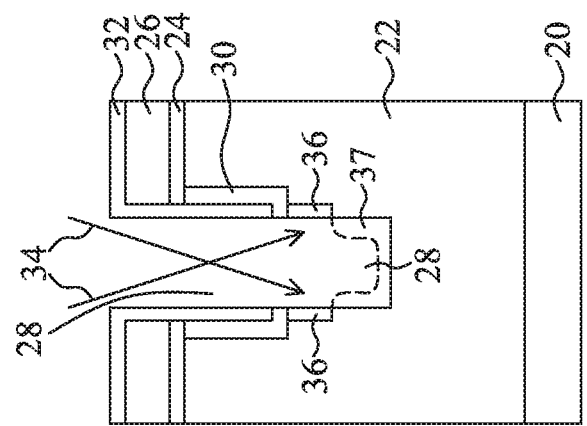
FIGS. 2A and 2B are cross-sectional views of intermediate stages in the manufacturing of a trench power MOSFET in accordance with alternative embodiments.
Figure 2A:
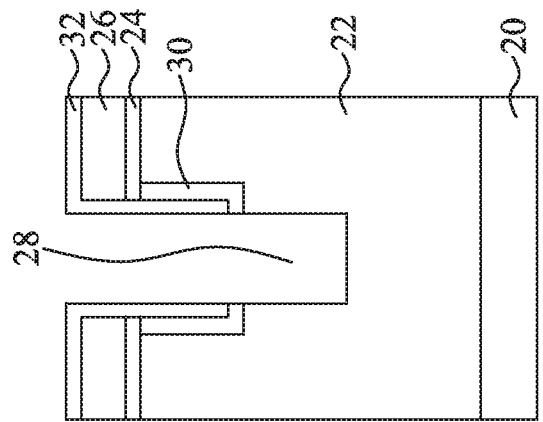

FIGS. 2A and 2B illustrate cross-sectional views of intermediate stages in the formation of a power MOSFET in accordance with alternative embodiments. Unless specified otherwise, the materials and formation methods of the components in these embodiments and the embodiments in FIGS. 3A through 3H are essentially the same as the like components, which are denoted by like reference numerals in the embodiments shown in FIGS. 1A through 1J. The details of the like components shown in FIGS. 2A through 3H may thus be found in the discussion of the embodiment shown in FIGS. 1A through 1J.

The initial steps of these embodiments are essentially the same as shown in FIGS. 1A through 1C. Next, as shown in FIG. 2A, an etch step is performed to remove the bottom portion of hard mask layer 32, and extend trench 28 into epitaxy layer 22. The etching may be anisotropic, and the remaining hard mask layer 32 is used as the etching mask, which covers edge portions of trench 28, and leaves the center region of trench 28 not covered. Next, as shown in FIG. 2B, NDD regions 36 are formed by tilt implantation 34. In some embodiments, to form NDD regions 36, mask region 37 may be formed at the bottom of trench 28, so that the bottom surface of NDD regions 36 is higher than the bottom of trench 28. Mask region 37 is then removed. In alternative embodiments, mask region 37 is not formed, and a proper implantation angle is used such that the bottom surface of NDD regions 36 is higher than the bottom of trench 28. The NDD region 36 is self-aligned to the hard mask layer 32. Subsequent steps in these embodiments are essentially the same as what are shown in FIGS. 1F through 1J, and are not repeated herein.

Figure 3B:
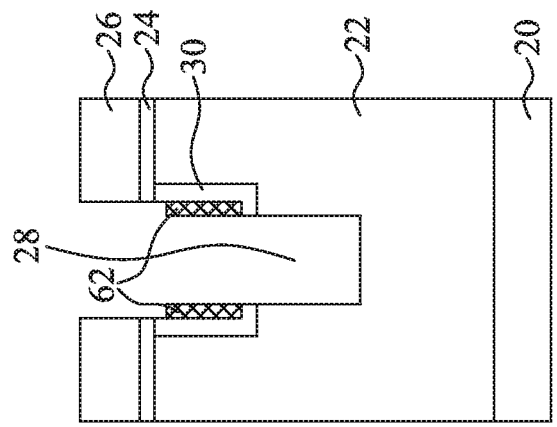
FIGS. 3A through 3H are cross-sectional views of intermediate stages in the manufacturing of a trench power MOSFET in accordance with yet alternative embodiments.
Figure 3A:
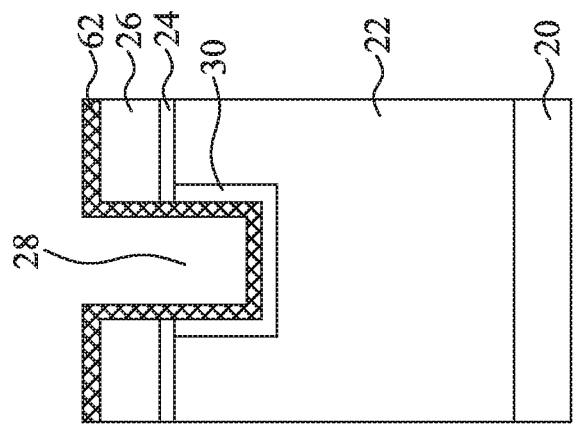

FIGS. 3A through 3H illustrate cross-sectional views of intermediate stages in the formation of a trench power MOSFET in accordance with yet alternative embodiments. The initial steps of these embodiments are essentially the same as shown in FIGS. 1A and 1B. Next, as shown in FIG. 3A, conductive layer 62 is formed. In some embodiments, conductive layer 62 is formed of polysilicon, and is referred to as polysilicon layer 62 hereinafter, although other conductive material such as metals, metal alloys, metal silicides, and the like, may also be used.

Referring to FIG. 3B, polysilicon layer 62 is etched. The horizontal portions of polysilicon layer 62 are removed, and some vertical portions of polysilicon layer 62 remain in trench 28. Next, the remaining portions of polysilicon layer 62 are used as a mask to etch oxide layer 30 and the underlying portion of epitaxy layer 22. Trench 28 thus extends into epitaxy layer 22.

Figure 3C:
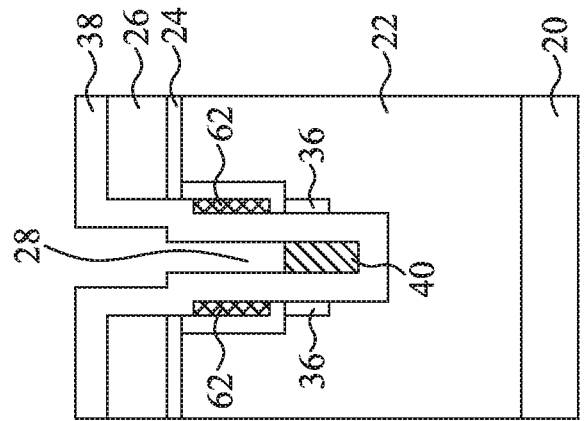
Figure 3D:
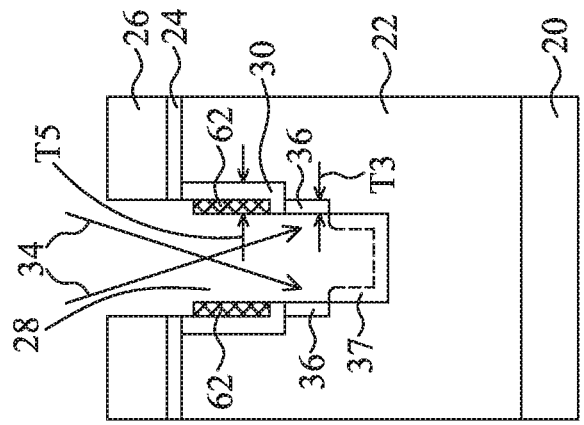

Referring to FIG. 3C, NDD regions 36 are formed through the tilt implantations of an n-type impurity. In some embodiments, to form NDD regions 36, mask region 37 may be formed at the bottom of trench 28, so that the bottom surface of NDD regions 36 may be higher than the bottom of trench 28. In alternative embodiments, mask region 37 is not formed, and a proper implantation angle is used such that the bottom surface of NDD regions 36 is higher than the bottom of trench 28. The NDD region 36 is self-aligned to the hard mask layer 32. It is observed that remain portions of polysilicon layer 62 overlap NDD regions 36, wherein the overlap width is close to the smaller one of thickness T5 of polysilicon layer 62 and thickness T3 of NDD regions 36. In FIG. 3D, dielectric layer 38 is formed, followed by the formation of field plate 40 at the bottom of trench 28. The formation of field plate 40 comprises a deposition step and an etch-back step. In FIG. 3E, dielectric layer 38 is etched back, and dielectric layer 42 is formed to cover field plate 40.

Figure 3F:
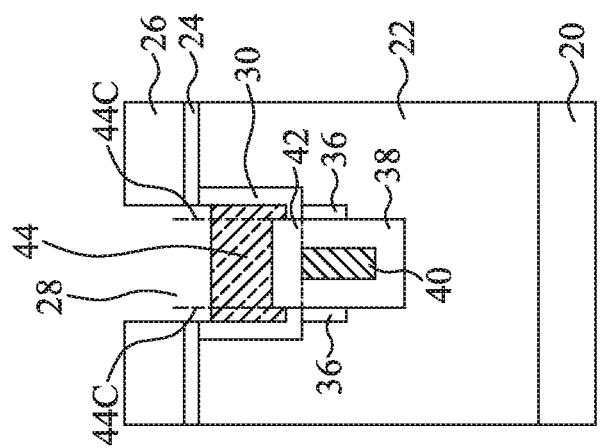
Figure 3E:
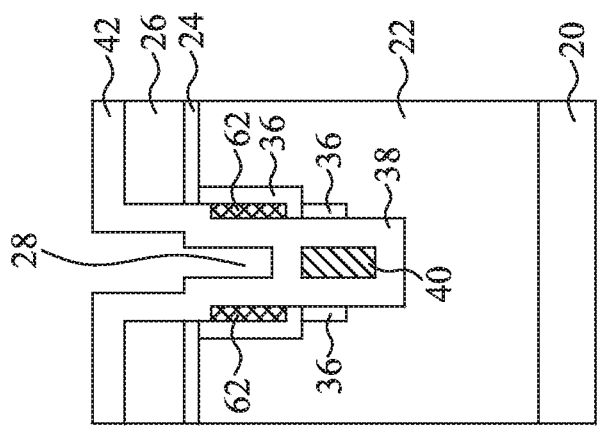
Figure 3H:
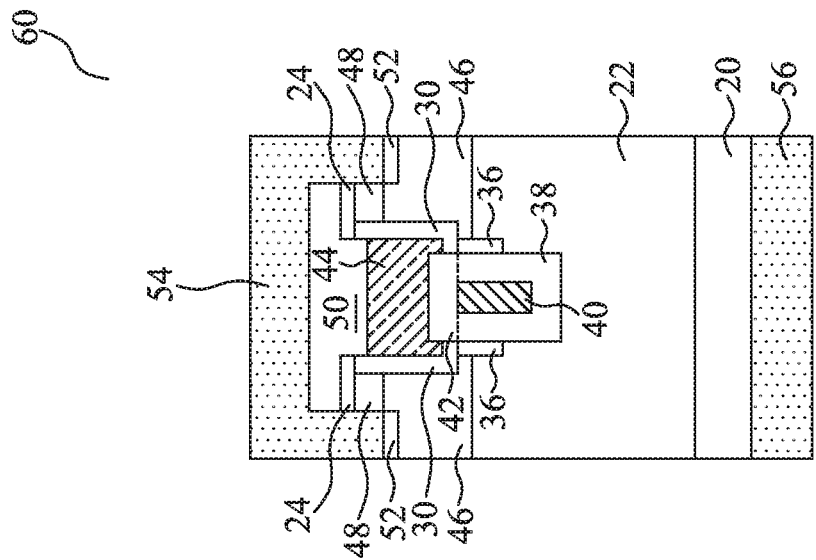
Figure 3G:
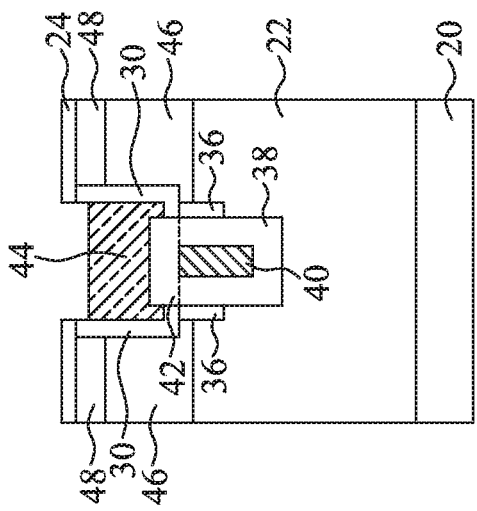

Next, in FIG. 3F, dielectric layer 42 is etched back so that the vertical portions of dielectric layer 42 on the sidewalls of trench 28 and the portions of dielectric layer 42 outside trench 28 are removed, while the portion over field plate 40 is left un-etched. A conductive material is then deposited, and then etched back. The portion of the conductive material in trench 28 is merged with the remaining portion of polysilicon layer 62 to form main gate 44. In some embodiments, the conductive material comprises polysilicon. It is appreciated that visible interface 44C may exist in main gate 44 since the two portions of main gate 44 are formed at different times. FIG. 3G illustrates the removal of hard mask layer 26. FIG. 3H illustrates the formation of p-bodies 46, heavily doped n-type regions 48, ILD 50, heavily doped p-type regions 52, source region 54, and drain region 56. The process details are not repeated herein.

Although the embodiments shown in FIGS. 1A through 3H provide methods of forming n-type power MOSFETs, the teaching is readily available for the formation of p-type power MOSFETs, with the conductivity types of the respective regions 20, 22, 36, 46, 48, and 52 inverted.

In accordance with embodiments, a device includes a semiconductor region of a first conductivity type, a trench extending into the semiconductor region, and a field plate in the trench, wherein the field plate is conductive. A first dielectric layer separates a bottom and sidewalls of the field plate from the semiconductor region. A main gate is disposed in the trench and overlapping the field plate. A second dielectric layer is disposed between and separating the main gate and the field plate from each other. A DD region of the first conductivity type is under the second dielectric layer, wherein an edge portion of the main gate overlaps the DD region. A body region includes a first portion at a same level as a portion of the main gate, and a second portion at a same level as, and contacting, the DD region, wherein the body region is of a second conductivity type opposite the first conductivity type.

In accordance with other embodiments, a device includes a semiconductor region of a first conductivity type selected from the group consisting essentially of p-type and n-type, and a trench extending from a top surface of the semiconductor region into the semiconductor region. A first dielectric layer is at a bottom and sidewalls of the trench. A field plate includes a bottom and sidewalls contacting the first dielectric layer, wherein the field plate is conductive. A main gate is in the trench and overlapping the field plate. A second dielectric layer is between and separating the main gate and the field plate from each other. A DD region of the first conductivity type includes a top surface contacting the second dielectric layer, and a sidewall contacting the first dielectric layer. The DD region has an impurity concentration greater than an impurity concentration of the semiconductor region.

In accordance with yet other embodiments, a method includes epitaxially growing an epitaxy semiconductor region of a first conductivity type, forming a first trench in the epitaxy semiconductor region, and forming an implantation mask extending into the trench and covering edge portions of the trench. A tilt implantation is performed to form a DD region in the epitaxy semiconductor region, wherein the DD region includes portions overlapped by the implantation mask, and wherein the DD region is of a first conductivity type. The epitaxy semiconductor region is etched to extend into the epitaxy semiconductor region, wherein the step of etching is performed using the implantation mask as an etching mask. After the step of etching, a first dielectric layer is formed lining a bottom and sidewalls of the trench. A field plate is formed in the trench and over the first dielectric layer, wherein the field plate includes a bottom and sidewalls contacting the first dielectric layer. A second dielectric layer is formed over the field plate. A main gate is formed in the trench and over the second dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a trench in a semiconductor region, wherein the semiconductor region is of a first conductivity type;
   forming a conductive layer extending into the trench and on an edge of the trench;
   forming a first dielectric layer on a bottom and sidewalls of the trench, wherein the first dielectric layer covers the conductive layer;
   forming a field plate in the trench and over a bottom portion of the first dielectric layer;
   forming a second dielectric layer over the field plate; and
   forming a conductive region in the trench and over the second dielectric layer, wherein the conductive region is merged with the conductive layer to form a main gate.

2. The method of claim 1 further comprising etching the semiconductor region to extend the trench deeper into the semiconductor region, with vertical portions of the conductive layer acting as an etching mask in the etching the semiconductor region.

3. The method of claim 1, wherein the forming the conductive layer comprises:
   depositing a blanket conductive layer; and
   removing portions of the blanket conductive layer outside of the trench.

4. The method of claim 1, wherein the forming the conductive layer comprises depositing a polysilicon layer.

5. The method of claim 1, wherein the forming the conductive layer comprises:
   removing horizontal portions of the conductive layer; and
   performing an implantation using vertical portions of the conductive layer as a part of an implantation mask to form a Doped Drain (DD) region in the semiconductor region.

6. The method of claim 5, wherein the implantation comprises a tilt implantation, and the DD region is overlapped by one of the vertical portions of the conductive layer.

7. The method of claim 5 further comprising forming a mask layer at the bottom of the trench, wherein a topmost end of the mask layer is lower than a bottom end of the conductive layer, with the implantation performed using the mask layer as a part of the implantation mask.

8. The method of claim 1, wherein the conductive region has edges flush with respective edges of the field plate.

9. The method of claim 1 further comprising implanting the semiconductor region to from a body region of a second conductivity type opposite to the first conductivity type, wherein the body region has a bottom lower than the main gate.

10. A method comprising:
    etching a semiconductor region to form a trench;
    forming a conductive layer in the trench and on a sidewall of the semiconductor region;
    forming a mask layer at a bottom of the trench;
    performing a tilt implantation to form a Doped Drain (DD) region in the semiconductor region, with the tilt implantation performed using the mask layer as a first part of an implantation mask, and the conductive layer acting as a second part of the implantation mask; and
    forming a conductive region in the trench, wherein the conductive region is merged with the conductive layer.

11. The method of claim 10 further comprising:
    forming a field plate in the trench; and
    forming a dielectric layer over the field plate, wherein the conductive region and the conductive layer are separated from the field plate by the dielectric layer.

12. The method of claim 10, wherein the DD region has a bottom higher than a bottom of the trench.

13. The method of claim 10, wherein the forming the conductive layer comprises depositing a polysilicon layer.

14. The method of claim 10, wherein the forming the conductive layer comprises:
    depositing a blanket conductive layer comprising horizontal portions and vertical portions; and
    etching the blanket conductive layer to remove the horizontal portions, wherein parts of the vertical portions in the trench remain as the conductive layer.

15. The method of claim 10, wherein the mask layer has a top surface lower than the conductive layer.

16. A method comprising:
    etching a semiconductor region to form a trench;
    oxidizing a surface layer of the semiconductor region in the trench to form an oxide layer;
    forming a first conductive layer and a second conductive layer in the trench and on opposite sidewalls of the trench, wherein the first conductive layer has a bottom contacting a top surface of the oxide layer;
    etching the oxide layer and the semiconductor region to extend the trench deeper into the semiconductor region, with the first conductive layer and the second conductive layer acting as an etching mask so that the trench extends down between the first conductive layer and the second conductive layer;
    performing a tilt implantation to form a Doped Drain (DD) region in the semiconductor region, with the tilt implantation performed using the first conductive layer and the second conductive layer as an implantation mask; and
    inserting a metallic region between and contacting the first conductive layer and the second conductive layer.

17. The method of claim 16, wherein the forming the first conductive layer and the second conductive layer comprises depositing a polysilicon layer.

18. The method of claim 16 further comprising forming a drain region overlapped by the DD region, wherein the drain region is electrically connected to the DD region.

19. The method of claim 16, wherein when the DD region has a bottom surface higher than a bottom of the trench.

20. The method of claim 16 further comprising:
    forming a first dielectric layer on a bottom and sidewalls of the trench, with the first dielectric layer having an edge contacting an edge of the DD region;
    forming a field plate in the trench and over a bottom portion of the first dielectric layer; and
    forming a second dielectric layer over the field plate, wherein the metallic region is overlying and contacting the second dielectric layer.

* * * * *